(12) United States Patent
Chen et al.

(10) Patent No.: US 6,902,258 B2
(45) Date of Patent: Jun. 7, 2005

(54) LDMOS AND CMOS INTEGRATED CIRCUIT AND METHOD OF MAKING

(75) Inventors: Zhizang Chen, Corvallis, OR (US); Bao-Sung Bruce Yeh, Corvallis, OR (US); S. Jonathan Wang, Albany, OR (US); Cathy P. Peltier, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/954,065

(22) Filed: Sep. 28, 2004

(65) Prior Publication Data

US 2005/0041070 A1 Feb. 24, 2005

Related U.S. Application Data

(62) Division of application No. 09/817,703, filed on Mar. 26, 2001, now Pat. No. 6,818,494.

(51) Int. Cl.[7] .............................. B41J 2/05; H01L 23/48; H01L 21/00
(52) U.S. Cl. .............................. 347/59; 257/742; 438/21
(58) Field of Search .............................. 347/59; 257/69, 257/341, 343, 370, 734, 742; 438/21

(56) References Cited

U.S. PATENT DOCUMENTS

| | | | |
|---|---|---|---|
| 4,325,180 A | 4/1982 | Curran | 29/571 |
| 4,628,341 A | 12/1986 | Thomas | 357/42 |
| 5,041,895 A | 8/1991 | Contiero et al. | |
| 5,047,358 A | 9/1991 | Kosiak et al. | 437/34 |
| 5,508,549 A | 4/1996 | Watanabe et al. | |
| 5,545,577 A | 8/1996 | Tada | |
| 5,585,294 A | 12/1996 | Smayling et al. | 437/44 |
| 5,747,850 A | 5/1998 | Mei | |
| 5,811,850 A | 9/1998 | Smayling et al. | 257/335 |
| 5,847,432 A | 12/1998 | Nozaki | |
| 5,852,314 A | 12/1998 | Depetro et al. | |
| 5,917,222 A * | 6/1999 | Smayling et al. | 257/370 |
| 6,017,797 A | 1/2000 | Furukawa | |
| 6,087,232 A | 7/2000 | Kim et al. | 438/289 |
| 6,111,297 A | 8/2000 | Grimaldi et al. | 257/401 |
| 6,127,213 A | 10/2000 | Tung | |
| 6,144,069 A | 11/2000 | Tung | 257/335 |
| 6,267,479 B1 | 7/2001 | Yamada et al. | |
| 6,508,530 B1 * | 1/2003 | Conta et al. | 347/19 |
| 6,576,512 B2 | 6/2003 | Taniguchi et al. | |

* cited by examiner

Primary Examiner—Lamson D. Nguyen
(74) Attorney, Agent, or Firm—Timothy F Myes

(57) ABSTRACT

An integrated circuit (IC) is formed on a substrate. The IC has a first well having a first dopant concentration that includes a second conductivity low-voltage transistor. The IC also has a second well having a dopant concentration equal to the first dopant concentration that includes a first conductivity high-voltage transistor. In addition, the IC has a third well having a second dopant concentration of an opposite type than the first well that includes a first conductivity low-voltage transistor. The first conductivity low-voltage transistor and the second conductivity low-voltage transistor are created without a threshold voltage ($V_t$) implant.

9 Claims, 11 Drawing Sheets

Fig. 5J (ELIMINATED STEP)

Fig. 5K (ELIMINATED STEP)

US 6,902,258 B2

LDMOS AND CMOS INTEGRATED CIRCUIT AND METHOD OF MAKING

This application is a divisional of Ser. No. 09/817,703, filed Mar. 26, 2001 now U.S. Pat. No. 6,818,494 which is hereby incorporated by reference.

FIELD OF THE INVENTION

This invention relates to the field of semiconductor integrated circuit devices, processes for making those devices and systems utilizing those devices. More specifically, the invention relates to a combined LDMOS and CMOS integrated circuit.

BACKGROUND OF THE INVENTION

CMOS (complimentary metal oxide semiconductors) integrated circuits are finding increased use in electronic applications such as printers. There are at least two important classes of transistor integrated circuits, low-voltage circuits in which the operating voltages are less than about six volts and high-voltage circuits in which the operating voltages are above about thirty volts. Moreover, the important difference in the two classes of transistors is that the high-voltage transistors require the channel region between the source and drain of the high-voltage transistor to be able to withstand a higher induced electric field without experiencing avalanche breakdown (punch through). As a consequence, the two classes of transistors have generally involved differences in structure, as well as differences in parameters. Such differences have dictated enough differences in processing that each class typically had been formed on its own separate integrated circuit (IC) rather than combined with the other class on a single IC.

Integrated circuit manufacturers have now incorporated high-voltage power MOSFET devices, such as a lateral double diffused MOS transistor (LDMOS) with CMOS control circuits to allow for versatility of design and increased reliability. This incorporation requires that relatively low-voltage CMOS logic circuits operate on the same die as a relatively high-voltage power transistor. While the incorporation has reduced total system costs, the fabrication of the combined CMOS and LDMOS transistors is still complex and expensive. In competitive consumer markets such as with printers and photo plotters, costs must continually be reduced in order to stay competitive and profitable. Further, the consumers expect increasingly reliable products because the cost of repair to the customers is often times higher than the cost of replacing the product. Therefore, to increase reliability and reduce costs, improvements are required in the manufacturing of integrated circuits that combine CMOS and LDMOS transistors.

SUMMARY

An integrated circuit (IC) is formed on a substrate. The IC has a first well having a first dopant concentration that includes a second conductivity low-voltage transistor. The IC also has a second well having a dopant concentration equal to the first dopant concentration that includes a first conductivity high-voltage transistor. In addition, the IC has a third well having a second dopant concentration of an opposite type than the first well that includes a first conductivity low-voltage transistor. The first conductivity low-voltage transistor and the second conductivity low-voltage transistor are created without a threshold voltage ($V_t$) implant.

BRIEF DESCRIPTION OF THE DRAWINGS

FIGS. 5A–5M are exemplary cross-sectional views of semiconductor processing steps used in FIGS. 4A and 4B.

DETAILED DESCRIPTION OF THE PREFERRED AND ALTERNATE EMBODIMENTS

Figure 1:
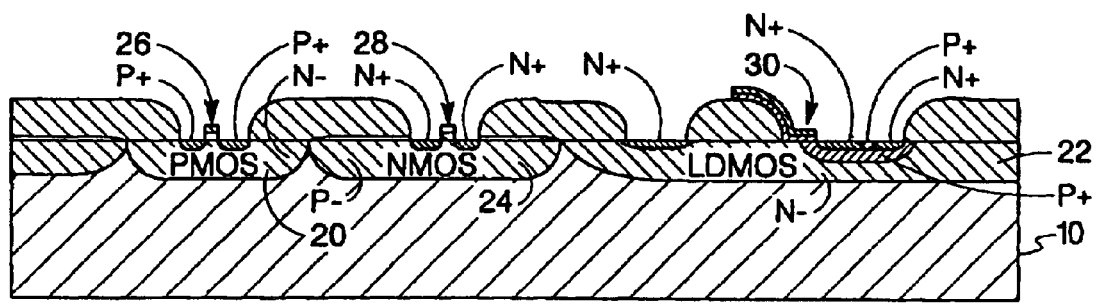
FIG. 1 is an exemplary cross-section of an integrated circuit that combines CMOS transistors with an LDMOS transistor.

In conventional IC processes, a threshold voltage ($V_t$) adjusting implant step is used as a control knob to adjust low-voltage CMOS transistor gate threshold voltages. The same $V_t$ implant is applied to both the NMOS and PMOS low-voltage transistors. The high-voltage LDMOS transistor is masked to prevent the $V_t$ implant in order to keep the on-resistance of the LDMOS transistor low. A $V_t$ protection mask for the LDMOS is used in conventional IC processes. For example, with a P substrate, the low-voltage CMOS N-Well has a higher doping concentration than the high-voltage LDMOS N-Well. The lower doping concentration for the high-voltage N-Well is required to maintain a high breakdown voltage (punch-through) and a low leakage current to the substrate. Due to these constraints, the low-voltage and the high-voltage N-Wells have different dopant concentrations levels.

The present invention is directed to a process for providing both high-voltage and low-voltage transistor devices in a common substrate that eliminates several process steps used in conventional processes. The invention simplifies and reduces the cost of conventional processes by redesigning the Well dopant concentrations and foregoing the $V_t$ adjust implant process steps while maintaining substantially the same threshold voltages and breakdown voltages of the conventional processes. Thus, well doping alone is used to control the $V_t$ of the NMOS and PMOS low-voltage transistors. For example, in one embodiment P-Well doping is used to control NMOS $V_{tn}$ and N-Well doping is used to control PMOS $V_{tp}$, separately, without using the $V_t$ adjust implant. This simplified process not only eliminates the $V_t$ implant step but also allows use of a single N-Well dopant concentration for both low-voltage PMOS and high-voltage LDMOS transistors. The improved process eliminates at least two photo mask layers (one N-Well mask and the $V_t$ block mask), two implants (one N-Well implant and the $V_t$ adjust implant) and one furnace operation (channel oxidation prior to the $V_t$ implant). Significant process cost reduction and cycle time is achieved. The changes in process flow between conventional and new processes occurs during the early stage of the new process, thus allowing the remaining steps of the new process to remain the same as with the conventional process.

It should be noted that the drawings are not true to scale. Moreover, in the drawings, heavily doped regions (concentrations of impurities of at least $1\times10^{19}$ impurities/$cm^3$) are designated by a plus sign (e.g., $n^+$ or $p^+$) and lightly doped regions (concentrations of no more than about $5\times10^{16}$ impurities/$cm^3$) by a minus sign (e.g. $p^-$ or $n^-$).

The specific process to be described involves a p-type substrate as the bulk in which N-Wells are formed for use with the low-voltage PMOS transistor and the high-voltage LDMOS transistor. Alternatively, an n-type substrate can be used as the bulk and a separate P-Well formed therein for use by low-voltage NMOS transistors.

Accordingly, the semiconductor devices of the present invention are applicable to a broad range of semiconductor devices and can be fabricated from a variety of semiconductor materials. The following description discusses several presently preferred embodiments of the semiconductor devices of the present invention as implemented in silicon substrates, since the majority of currently available semiconductor devices are fabricated in silicon substrates and the most commonly encountered applications of the present invention will involve silicon substrates. Nevertheless, the present invention may also advantageously be employed in gallium arsenide, germanium, and other semiconductor materials. Accordingly, the present invention is not intended to be limited to those devices fabricated in silicon semiconductor materials, but will include those devices fabricated in one or more of the available semiconductor materials available to those skilled in the art.

Moreover, while the present invention is illustrated by preferred embodiments directed to silicon semiconductor devices, it is not intended that these illustrations be a limitation on the scope or applicability of the present invention. Further, while the illustrative examples use insulative gate control structures, it should be recognized that the insulated gate portions may be replaced with light activated or current activated structure(s). Thus, it is not intended that the semiconductor devices of the present invention be limited to the structures illustrated. These structures are included to demonstrate the utility and application of the present invention to presently preferred embodiments.

Further, various parts of the semiconductor elements have not been drawn to scale. Certain dimensions have been exaggerated in relation to other dimensions in order to provide a clearer illustration and understanding of the present invention. For the purposes of illustration the preferred embodiment of semiconductor devices of the present invention have been shown to include specific P and N type regions, but it should be clearly understood that the teachings herein are equally applicable to semiconductor devices in which the conductivities of the various regions have been reversed, for example, to provide the dual of the illustrated device. Enhancement and depletion mode structures may be similarly interchanged.

Further, although the embodiments illustrated herein are shown in two-dimensional views with various regions having depth and width, it should be clearly understood that these regions are illustrations of only a portion of a single cell of a device, which may include a plurality of such cells arranged in a three-dimensional structure. Accordingly, these regions will have three dimensions, including length, width, and depth, when fabricated on an actual device.

The term high-voltage denotes the voltages to which the drain of the device formed will be subjected; high-voltages, such as twelve and eighteen volts with transients greater than 40V usually require larger and deeper wells but with smaller (or lighter) dopant concentrations. Low-voltage devices are subjected to voltages generally less than 10 volts, preferably less than 6V.

FIG. 1 is an exemplary cross-section of an integrated circuit that combines low-voltage CMOS transistors with a high-voltage LDMOS transistor. The integrated circuit includes a substrate 10, preferably silicon, that contains a first region 20, preferably an N-doped well, a second region 22, preferably an N-doped well, and a third region 24, preferably a P-doped well. The first region 20 includes a second conductivity low-voltage transistor 26, preferably a PMOS type device. The third region 24 includes a first conductivity low-voltage transistor 28, preferably an NMOS type device. The second region 22 includes a first conductivity high-voltage transistor 30, preferably a lateral dual diffusion MOS (LDMOS) device. The first region 20 is doped with a predetermined concentration of impurities chosen to determine the voltage threshold of the second conductivity low-voltage transistor 26. Also, the predetermined concentration of impurities that is chosen also sets the breakdown voltage of the first conductivity high-voltage transistor 30 in the second region 22. The second region 22 receives the same predetermined concentration of impurities as the first region 20. The predetermined concentration of impurities is chosen to take into account that a threshold voltage ($V_t$) implant step will not be performed on the second conductivity low-voltage transistor 26. When choosing the predetermined concentration, the process designer must also take into account that the selected value determines the voltage breakdown of the first conductivity high-voltage transistor. For example, in a conventional process, the first low-voltage and high-voltage N-Well region's doping concentration is approximately $2.5\times10^{12}$ impurities/$cm^2$ at 160 Kev implant energy. Then in the conventional process, the first N-Well region 20 would receive an additional dopant implant of approximately $8.5\times10^{12}$ impurities/$cm^2$ at 160 Kev implant energy to compensate for the later $V_t$ implant step. For the modified process, only a single doping implant concentration is done for the first 20 and second 22 N-Well regions. The predetermined concentration for the modified process is adjusted to compensate for the lack of $V_t$ implant to be $2.75\times10^{12}$ to $3.0\times10^{12}$ impurities/$cm^2$, preferably $2.75\times10^{12}$ impurities/$cm^2$ at 160 Kev implant energy. This predetermined doping level is applied simultaneously to the first and second regions such that they receive essentially the same dopant concentration. Because the invention removes the $V_t$ implant step, the conventional process's additional dopant implant step is not required. This also saves a photolithography step required to mask the second region 22 during the conventional process's additional dopant implant step. By keeping the impurity concentration low in both the first region 20 and the second region 22, the breakdown voltage of the first conductivity high-voltage transistor 30 is maintained. Preferably, the breakdown voltage of the first conductivity high-voltage transistor 30 is greater than 40 volts.

Figure 2:
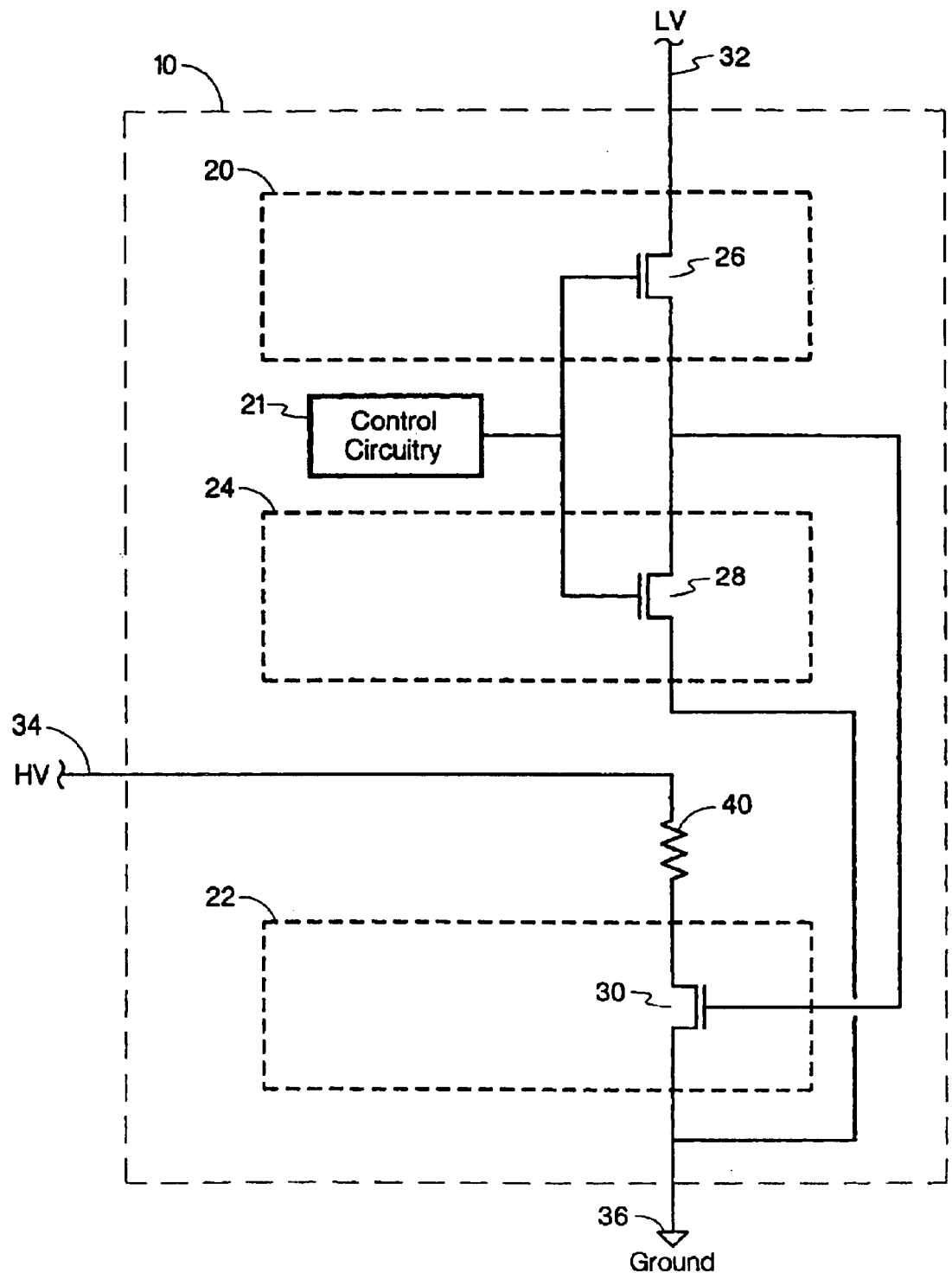
FIG. 2 is an exemplary block diagram of a circuit using the combined CMOS and LDMOS transistors embodied by the invention.

FIG. 2 is an exemplary block diagram of a circuit using the combined CMOS and LDMOS transistors of the invention in a printing application. The second conductivity low-voltage transistor 26 in the first region 20 has its source connected to a low-voltage supply 32, preferably about 5 volts or less. The first conductivity low-voltage transistor 28 in the third region 24 has its source connected to ground 36. The drains of the first and second conductivity low-voltage transistors are connected and coupled to the gate of the first conductivity high-voltage transistor 30 that resides in the second region 22. The source of the first conductivity high-voltage transistor 30 is connected to ground 36. The drain of the first conductivity high-voltage transistor 30 is coupled to an energy dissipation element 40 that is further coupled to a high-voltage supply 34, preferably greater than 40 Volts. The first, second and third regions reside in substrate 10 of the integrated circuit. Other control circuitry 21 on the integrated circuit or signals external to the integrated circuit are connected to the gates of the first and second conductivity low-voltage transistors to control their switching which in turn controls the on-off state of the first conductivity high-voltage transistor 30 which further controls current from the high-voltage supply 34 to the energy dissipation element 40, preferably a thin film resistor used to eject fluid.

Figure 3A:
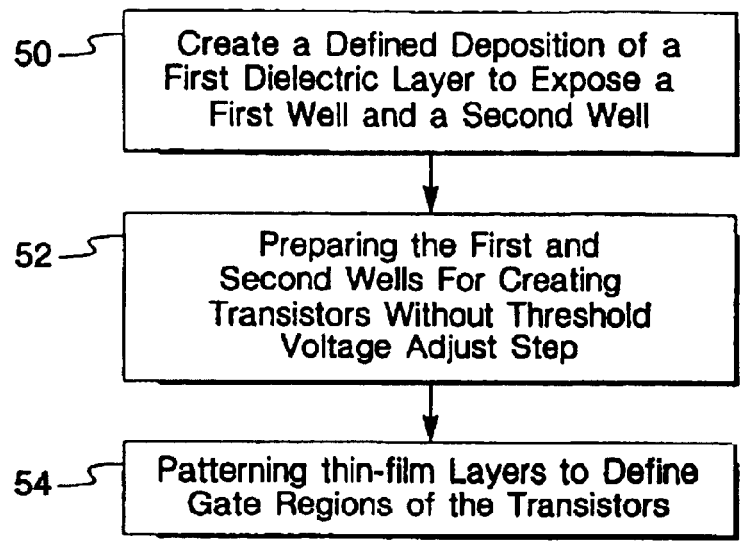
FIG. 3A is an exemplary flow chart of a process embodying the invention.

FIG. 3A is an exemplary flow chart of a process for creating an integrated circuit with a second conductivity low-voltage transistor in a first region, a first conductivity high-voltage transistor in a second region, and a first conductivity low-voltage transistor in a third region. In block 50 the first step is to create a defined deposition of a first dielectric layer to expose a first well for the first region and a second well for the second region. In block 52, the first well and the second well are prepared for creating transistors without using a voltage threshold step. This step is performed by selectively doping the first and second well with essentially the same concentration of impurities such that the desired first conductivity low-voltage transistor threshold voltage is met while still maintaining the breakdown voltage requirement of the first conductivity high-voltage transistor, then selectively doping the third region with a second dopant concentration to control the threshold voltage of the first conductivity low-voltage transistor. By selectively choosing the dopant levels the conventional step of applying a threshold voltage adjustment implant to the first and second conductivity low-voltage transistors is excluded. After the preparation of the regions/wells for creating transistors, the first and second regions/wells have substantially the same dopant concentration of impurities. After the first, second and third regions/wells are prepared, in step 54, thin-film layers are applied and patterned on the regions to define gate areas of the desired transistors.

Figure 3B:
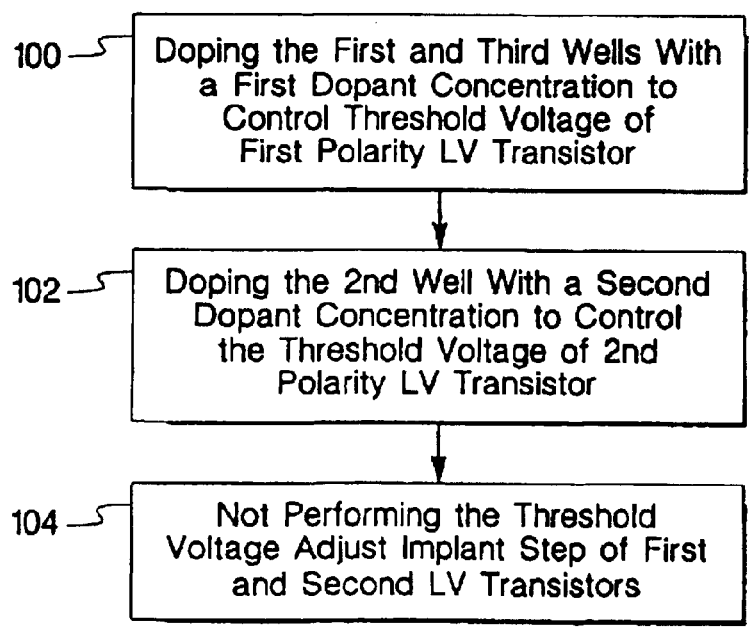
FIG. 3B is an exemplary flow chart for a process that incorporates the invention.

FIG. 3B is an exemplary flow chart describing the process of step 52 of FIG. 3A which incorporates the invention. In step 100, the first and third wells are doped with a first dopant concentration to control and set the threshold voltage ($V_t$) of the first polarity low-voltage transistor. Then in step 102, the second well is doped with a second dopant concentration to control and set the threshold voltage of the second polarity low-voltage transistor. Finally, in step 104, because of the chosen dopant concentrations used in steps 100 and 102, the threshold voltage adjust implant step of conventional processes is not performed on the first and second polarity low-voltage transistors.

Figure 4A:
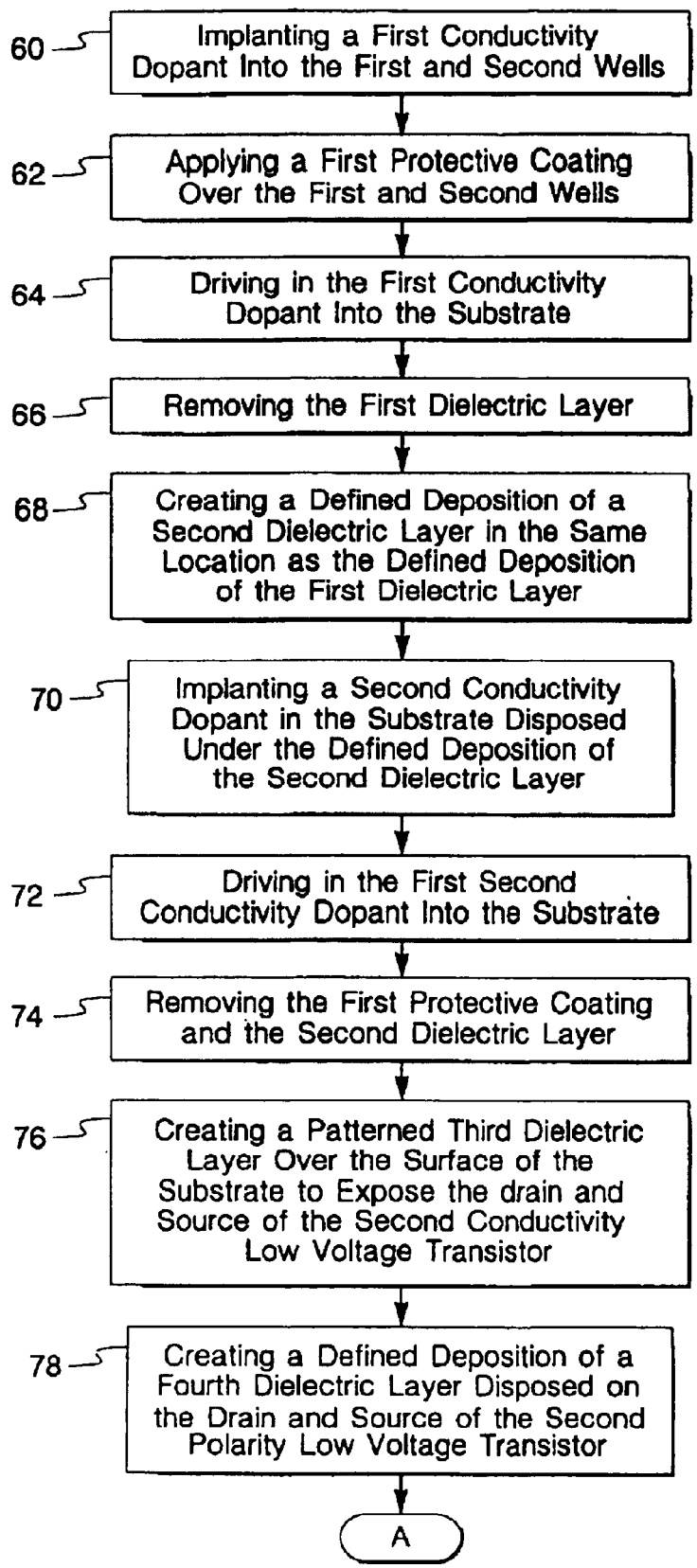
FIGS. 4A and 4B is an exemplary flow chart of a semiconductor process embodying the invention.
Figure 4B:
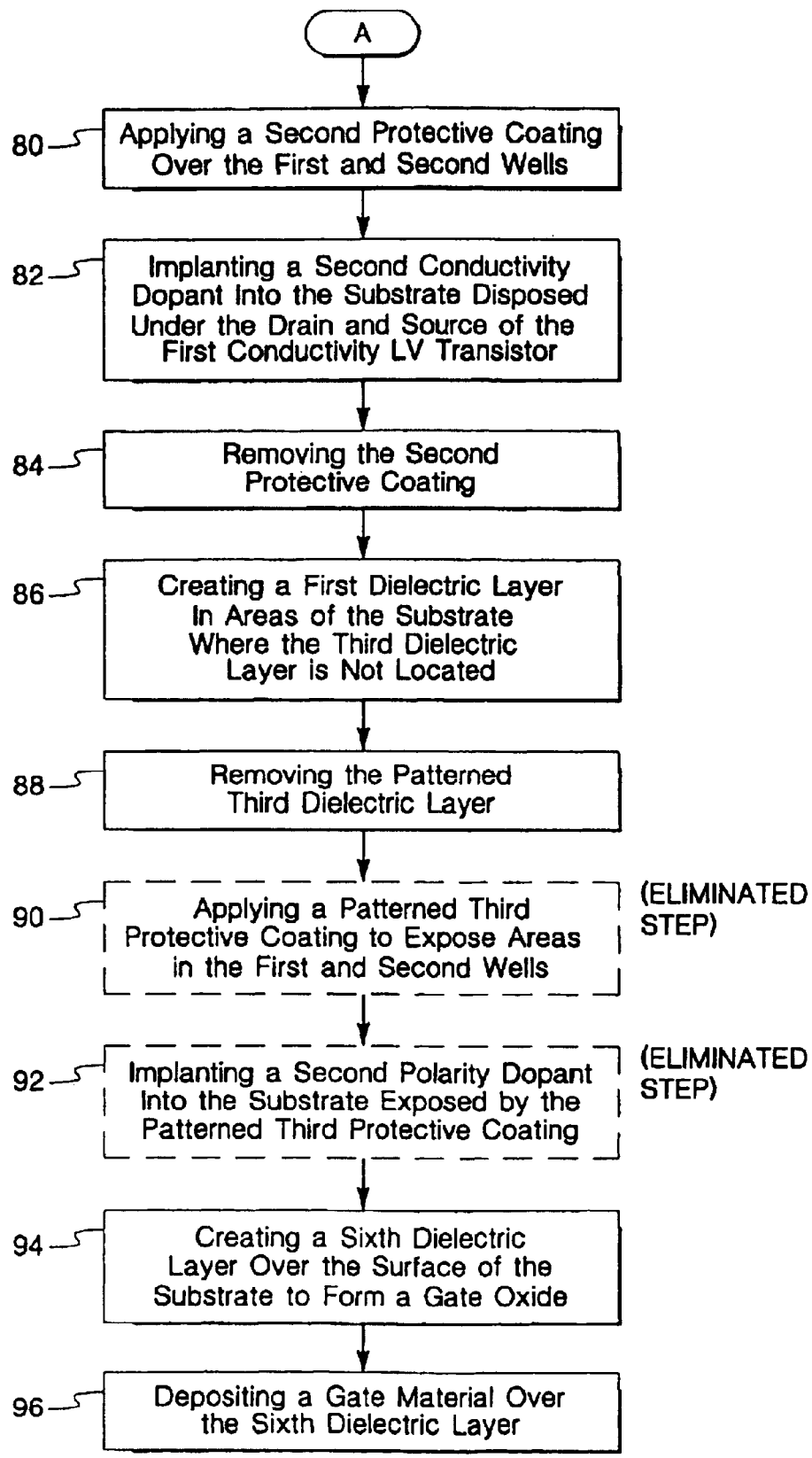
Figure 5A:
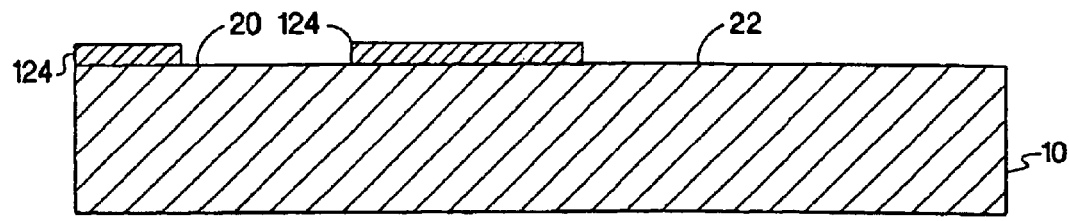
Figure 5B:
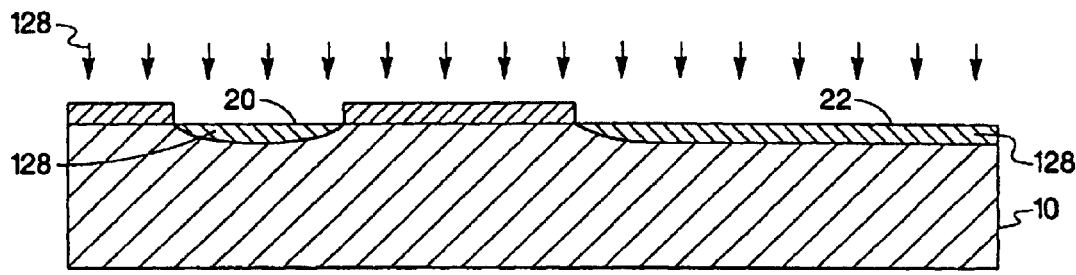
Figure 5C:
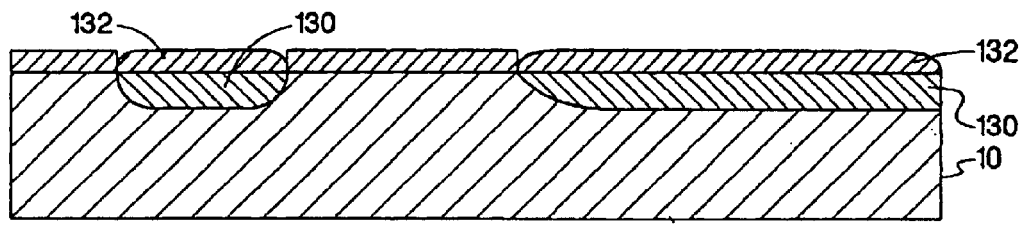
Figure 5D:
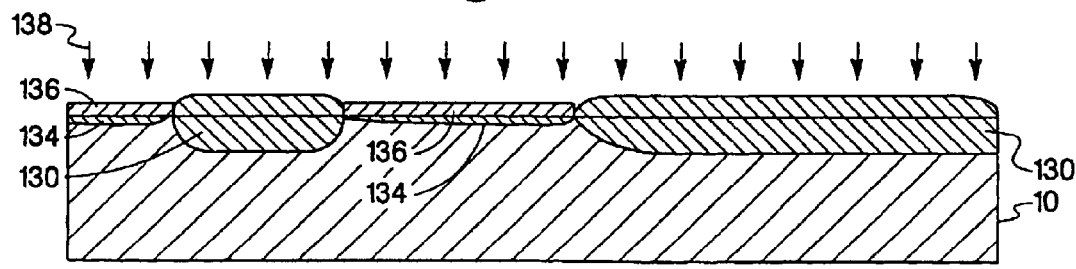
Figure 5E:
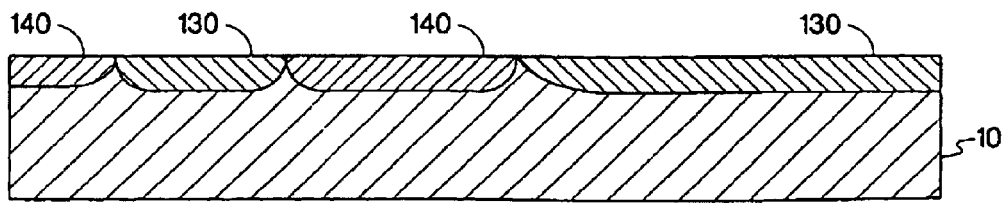
Figure 5F:
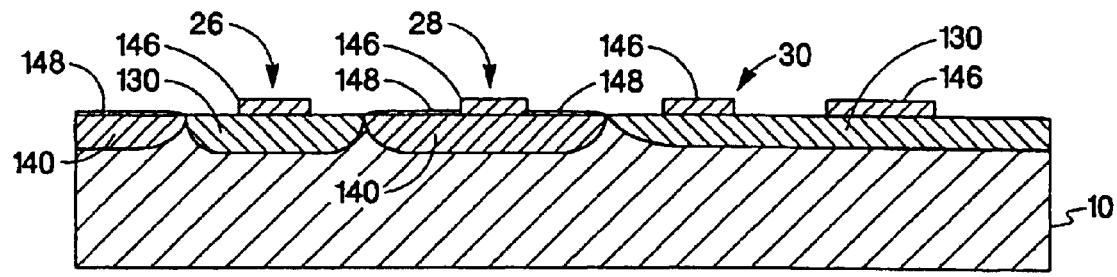
Figure 5G:
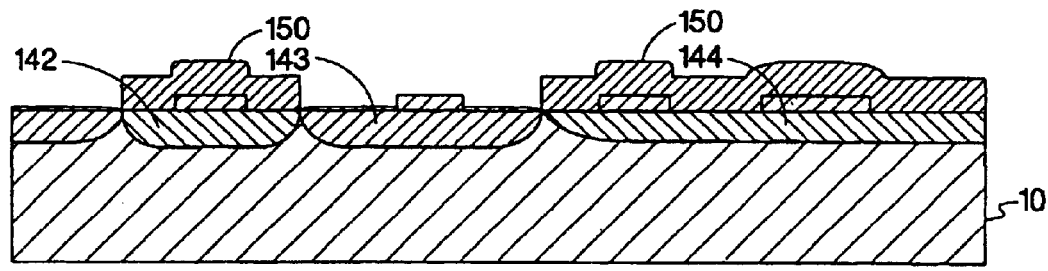
Figure 5H:
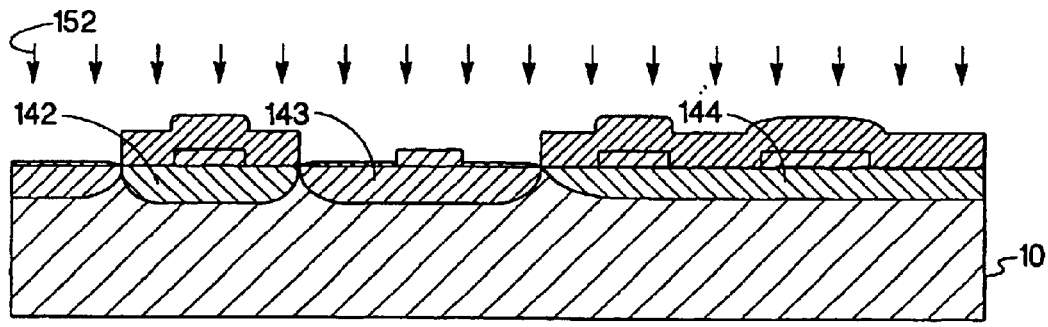
Figure 5I:
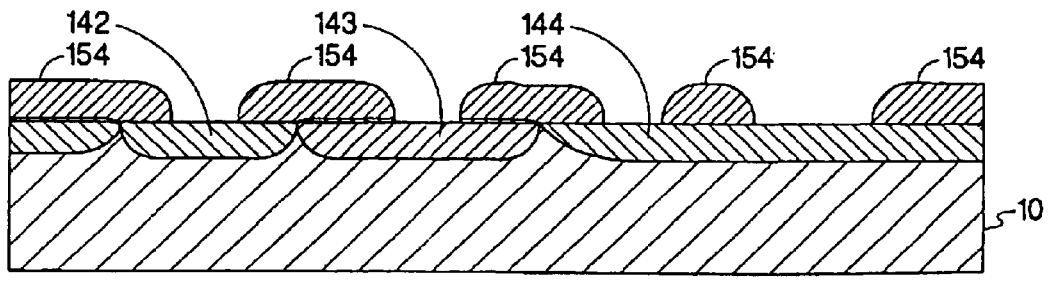

FIGS. 4A and 4B make up an exemplary flow chart of a modified semiconductor process embodying the invention. FIGS. 5A through 5M are cross-sectional views of exemplary and some excluded process steps on a substrate 10. The step 50 of FIG. 3A of creating a defined deposition of a first dielectric layer 124 to expose a first region 20 and a second region 22, is illustrated in FIG. 5A. The first dielectric layer 124 can be made of one or more conventional thin film dielectrics. An exemplary first dielectric layer is made up of 200 Angstroms of SRO (stress relief oxide) and 900 Angstroms of silicon nitride. The process step 52 of FIG. 3A can be performed to provide the selective doping of the well regions with essentially the following steps. As shown in FIG. 5B and in step 60 of FIG. 4A, a first conductivity dopant of impurities 128 is implanted into the first and second 20/22 regions. An exemplary N-Well implant is 2.8 to $3.0 \times 10^{12}$ impurities/cm$^2$ of phosphorous at 160 keV of energy. Then in step 62 and FIG. 5C, a first protective coating 132 is applied over the first and second 20/22 regions. An exemplary first protective coating is field oxide (FOX). Then in step 64 and FIG. 5O, the first conductivity dopant 128 is driven into the substrate to form regions 132 by baking the substrate 10, such as at 1200° C. for 4 hours. Then in step 66, the first dielectric layer 124 is removed. Then in step 68 and FIG. 5D, a defined deposition of a second dielectric layer 136 is created in the same location as the defined deposition of the first dielectric layer 124, such as channel oxide. Then in step 70 and FIG. 5D, a second conductivity dopant 138 is implanted in the substrate 10 as second conductivity implant 134 and disposed under the defined deposition of the second dielectric layer 136. An exemplary second conductivity dopant 138 is boron at a concentration of $9.8 \times 10^{12}$ impurities/cm$^2$ at an energy of 33 keV. Then in step 72 and FIG. 5E, the second conductivity implant 134 is driven into the substrate 10 to form a driven second conductivity implant 140, preferably by baking the substrate 10 at 1200° C. at 4 hours. Then in step 74 and FIG. 5E, the first protective coating 132 and the second dielectric layer 136 are removed, for example, by using an oxide strip. Then in step 76 and FIG. 5F, a patterned third dielectric layer 146 is created over the surface of the substrate to expose the drain and source of the first 28 and second 26 conductivity low-voltage transistors and the first conductivity high-voltage transistor 30. The third dielectric layer 146 can be made of one or more dielectric layers. An exemplary third dielectric layer is made up of 200 Angstroms of SRO and 900 Angstroms of silicon nitride. Then in step 78, a is defined deposition of a fourth dielectric layer 148 is created and disposed on the drain and source of the first conductivity low-voltage transistor 28. Then in step 80 and FIG. 5G, a second protective coating 150, for example photoresist, is applied over the first 142 and second 144 wells. Then in step 82 and FIG. 5H, a second conductivity field dopant 152 is implanted into the substrate and disposed under the drain and source of the first conductivity low-voltage transistor 28. An exemplary concentration of the second conductivity field dopant 152 is boron at a concentration of $8.5 \times 10^{12}$ impurities/cm$^2$ at and energy of 120 keV. Then in step 84, the second protective coating 150 is removed. Then in step 86 and FIG. 5I, a fifth dielectric layer 154, for example FOX, is created in areas of the substrate where the third dielectric layer 146 is not located. Then in step 88, the patterned third dielectric layer 146 is removed, for example with an oxide strip.

FIGS. 5J and 5K and steps 90 and 92 illustrate at least some of the process steps of a threshold voltage adjust implant that have been eliminated by the invention that occur in conventional processes. In FIG. 5J, a third protective coating 180 such as photoresist is disposed and patterned on the substrate 10. The third protective coating 180 has patterned opening to expose the transistor regions of the first well 142 and the third well 143. In FIG. 5K, a second conductivity implant, a threshold voltage adjust 160, is implanted into the surface of the transistor regions 162/164 that are exposed. An exemplary threshold voltage adjust implant is boron at a doping concentration of $2 \times 10^{12}$ impurities/cm$^2$ at an energy of 35 keV to limit its implantation to near the surface of the transistor.

Figure 5L:
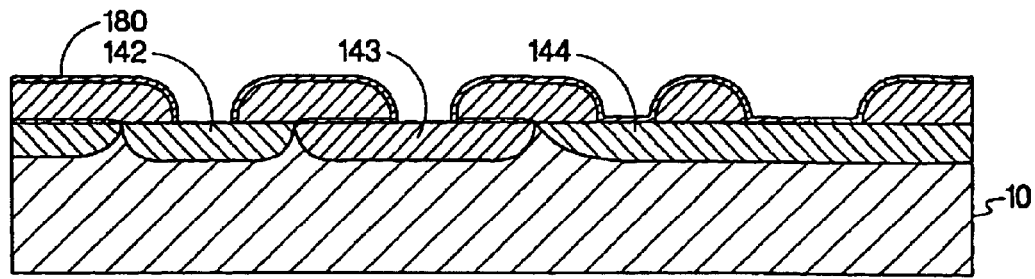
Figure 5L:
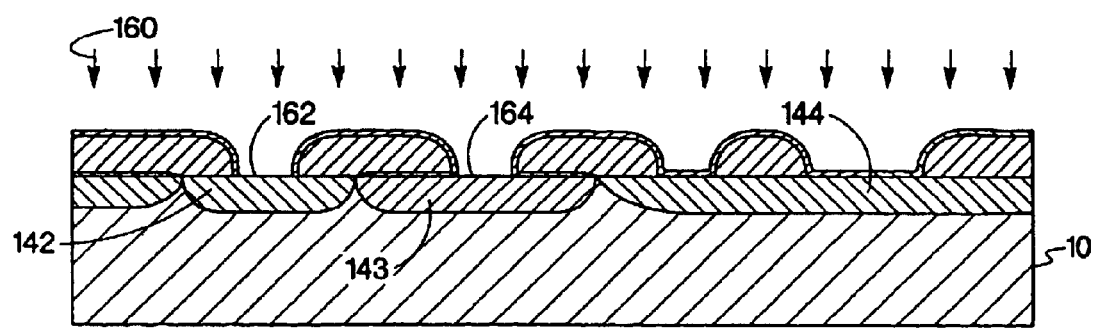
Figure 5L:
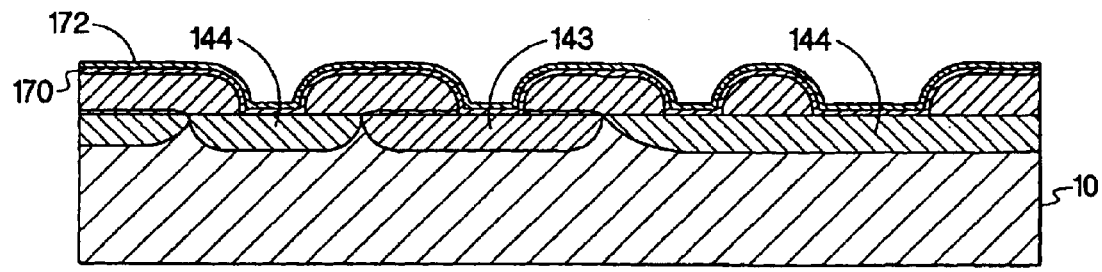
Figure 5M:
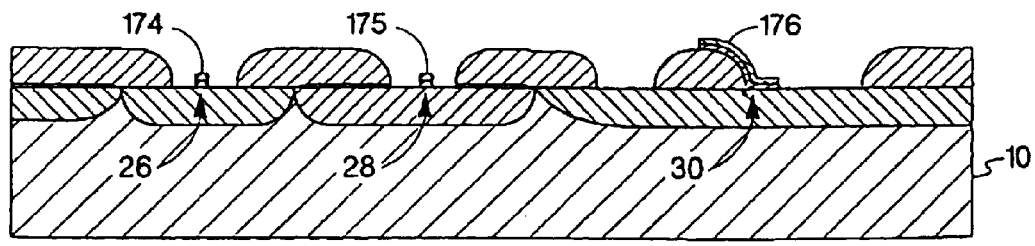

In step 94 and FIG. 5L, a sixth dielectric layer 170 is created over the surface of the substrate 10 to form a gate oxide, for example 200 Angstroms of SiO$_2$. In step 96, a gate material 172 is deposited over the sixth dielectric layer 170, for example, 3600 Angstroms of polysilicon deposition. Optionally, the gate material 172 can be doped to increase conductivity. Finally, in step 54 of FIG. 3A and FIG. 5M, the sixth dielectric layer 170 and the gate material 172 are patterned to define the gate regions 175 of the first 26 and second 28 conductivity low-voltage transistors and the gate region 176 of the first conductivity high-voltage transistor 30.

Figure 6:
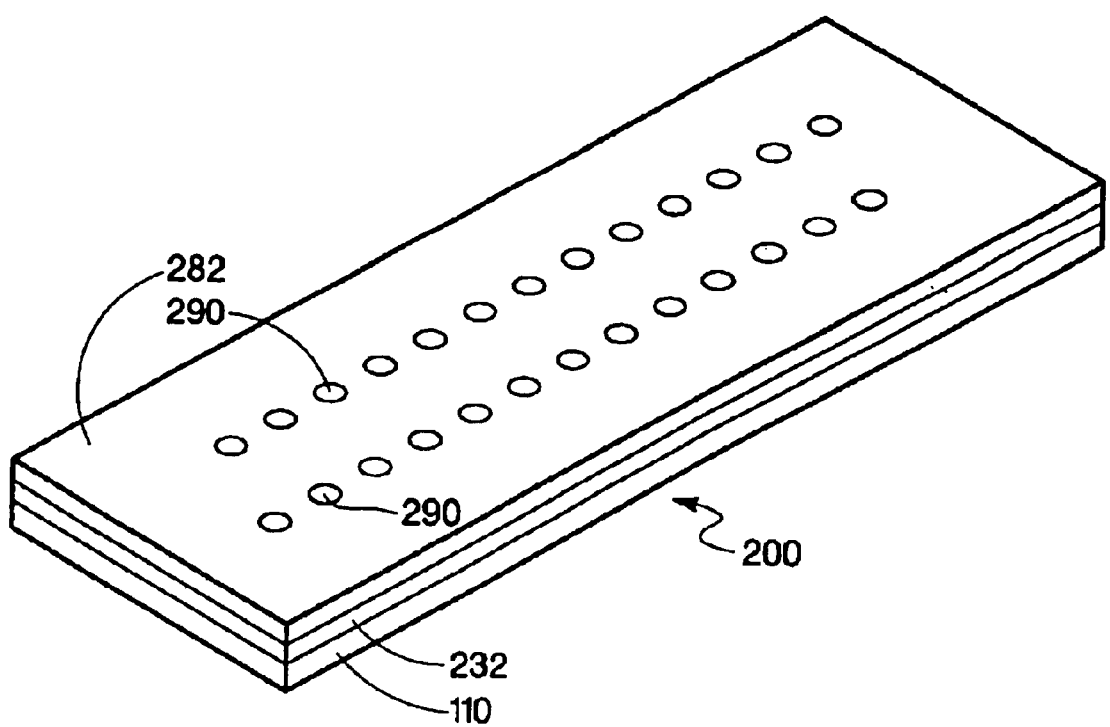
FIG. 6 is an exemplary printhead integrated circuit made by a process that embodies the invention.

FIG. 6 is an exemplary prospective view of an integrated circuit, a fluid jet printhead 200, which embodies the invention. Disposed on substrate 110 is a stack of thin-film layers 232 that make up the circuitry illustrated in FIG. 2. Disposed on the surface of the integrated circuit is an orifice layer 282 that defines at least one opening 290 for ejecting fluid. The opening(s) is fluidically coupled to the energy dissipation element(s) 40 (not shown) of FIG. 2.

Figure 7:
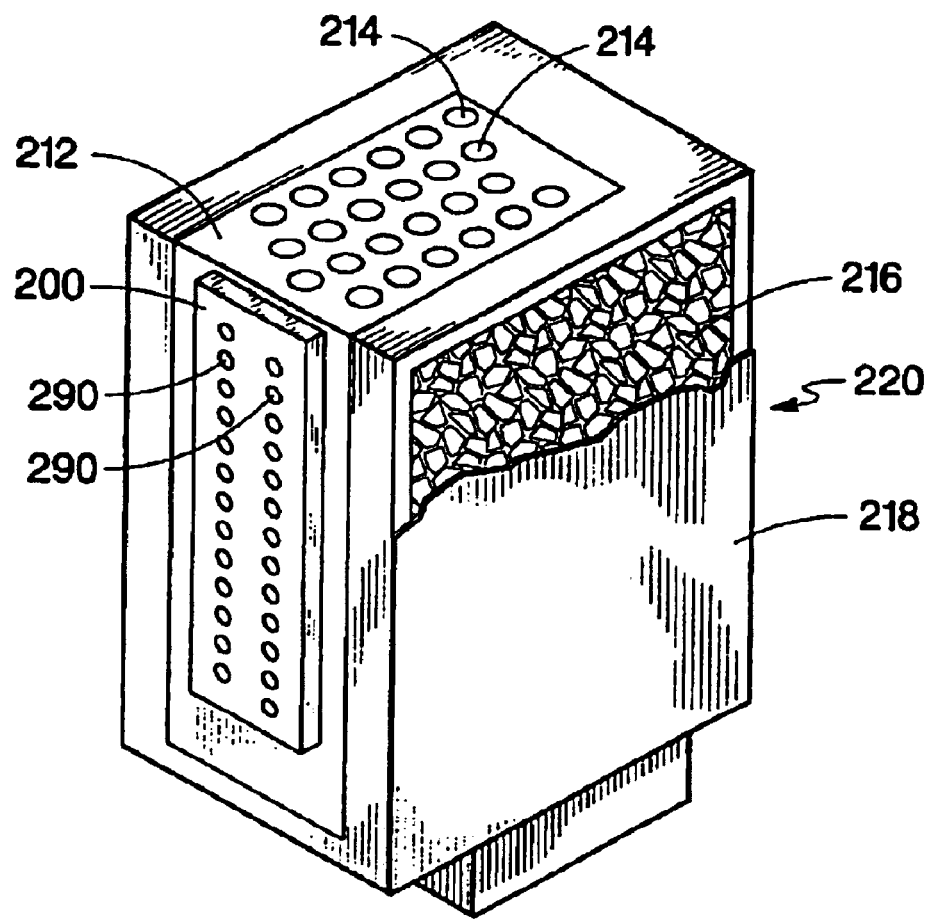
FIG. 7 is an exemplary recording cartridge that includes the exemplary printhead of FIG. 6.

FIG. 7 is an exemplary recording cartridge 220 that incorporates the fluid jet printhead 200 of FIG. 6. The recording cartridge 220 has a body 218 that defines a fluid reservoir. The fluid reservoir is fluidically coupled to the openings 290 in the orifice layer 282 of the fluid jet printhead 200. The recording cartridge 220 has a pressure regulator 216, illustrated as a closed foam sponge to prevent the fluid within the reservoir from drooling out of the opening 290. The energy dissipation elements 40 (see FIG. 2) in the fluid jet printhead 200 are connected to contacts 214 using a flex circuit 212.

Figure 8:
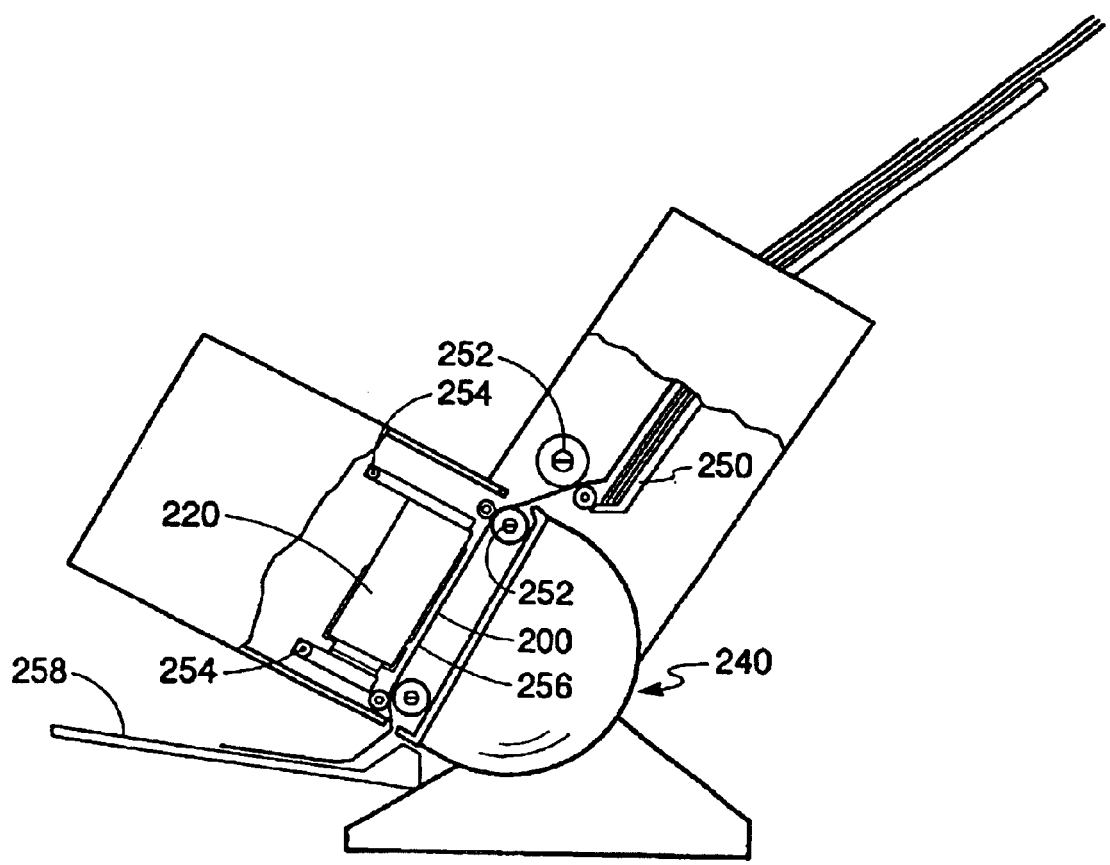
FIG. 8 is an exemplary recording device that includes the exemplary fluid cartridge of FIG. 7.

FIG. 8 is an exemplary recording device 240 that uses the recording cartridge 220 of FIG. 7. The recording device 240 includes a medium tray 250 for holding media. The recording device 240 has a first transport mechanism 252 to move a medium 256 from the medium tray 250 across a first direction of the fluid jet printhead 200 on the recording cartridge 220. The recording device 240 optionally has a second transport mechanism 254 that holds the recording cartridge 220 and transports the recording cartridge 220 in a second direction, preferably orthogonal to the first direction, across the medium 256.

What is claimed is:

1. An integrated circuit on a substrate, comprising:

a first well having a first dopant concentration and including a second conductivity type low-voltage transistor;

a second well having a dopant concentration equal to the first dopant concentration and including a first conductivity type high-voltage transistor;

a third well having a second dopant concentration of an opposite type than the first well and including a first conductivity type low-voltage transistor; and wherein the first conductivity type low-voltage transistor and the second conductivity type low-voltage transistor are created without a threshold voltage ($V_t$) implant.

2. The integrated circuit of claim 1, wherein the first conductivity type high-voltage transistor is a lateral dual-diffusion metal oxide semiconductor.

3. The integrated circuit of claim 2, wherein the first conductivity type high-voltage transistor has a breakdown voltage of greater than 40 volts.

4. The integrated circuit of claim 1, further comprising an energy dissipation element coupled to said first conductivity type high-voltage transistor.

5. A fluid jet printhead, comprising:

the integrated circuit of claim 4; and an orifice layer defining an opening for ejecting fluid thermally coupled to said energy dissipation element, said orifice layer disposed on the surface of the integrated circuit.

6. A recording cartridge, comprising:

the fluid jet printhead of claim 5;

a body defining a fluid reservoir, said fluid reservoir fluidically coupled to the opening in said orifice layer of the fluid jet printhead; and a pressure regulator to control the pressure of the fluid reservoir within the body of the recording cartridge.

7. A recording device for placing fluid on a medium, comprising:

the recording cartridge of claim 6; and a transport mechanism to move the recording cartridge in at least one direction with respect to the medium.

8. The integrated circuit of claim 1 wherein the first and second wells are an N-wells and wherein the third well is a P-well.

9. The integrated circuit of claim 1 wherein the first conductivity type high-voltage transistor is an n conductivity type high-voltage transistor.

* * * * *

UNITED STATES PATENT AND TRADEMARK OFFICE
CERTIFICATE OF CORRECTION

PATENT NO.    : 6,902,258 B2
DATED         : June 7, 2005
INVENTOR(S)   : Chen et al.

It is certified that error appears in the above-identified patent and that said Letters Patent is hereby corrected as shown below:

Column 6,
Line 4, delete "50," and insert therefor -- 5C, --.

Signed and Sealed this

Thirteenth Day of December, 2005

JON W. DUDAS
*Director of the United States Patent and Trademark Office*